(12) United States Patent
Pedersen

(10) Patent No.: US 6,995,590 B1
(45) Date of Patent: Feb. 7, 2006

(54) HYBRID PHASE/DELAY LOCKED LOOP CIRCUITS AND METHODS

(75) Inventor: Bruce Pedersen, San Jose, CA (US)

(73) Assignee: Altera Corporation, San Jose, CA (US)

(*) Notice: Subject to any disclaimer, the term of this patent is extended or adjusted under 35 U.S.C. 154(b) by 2 days.

(21) Appl. No.: 10/668,447

(22) Filed: Sep. 22, 2003

(51) Int. Cl.
H03L 7/06 (2006.01)

(52) U.S. Cl. ........................ 327/158; 327/159; 327/263

(58) Field of Classification Search .............. 327/156, 327/158–161, 263, 276, 277
See application file for complete search history.

(56) References Cited

U.S. PATENT DOCUMENTS

| | | | |
|---|---|---|---|
| 5,150,863 A | 9/1992 | Hozumi | |
| 5,506,878 A | 4/1996 | Chiang | |
| 5,771,264 A | 6/1998 | Lane | |
| 5,815,016 A | 9/1998 | Erickson | |
| 5,999,025 A | 12/1999 | New | |
| 6,114,915 A | 9/2000 | Huang et al. | |
| 6,150,863 A | 11/2000 | Conn et al. | |
| 6,191,613 B1 | 2/2001 | Schultz et al. | |
| 6,204,695 B1 | 3/2001 | Alfke et al. | |
| 6,252,419 B1 | 6/2001 | Sung et al. | |
| 6,271,729 B2 | 8/2001 | Sung et al. | |
| 6,282,253 B1 * | 8/2001 | Fahrenbruch | 375/371 |
| 6,292,016 B1 | 9/2001 | Jefferson et al. | |
| 6,292,116 B1 | 9/2001 | Wang et al. | |
| 6,326,812 B1 | 12/2001 | Jefferson | |
| 6,777,990 B2 * | 8/2004 | Partsch et al. | 327/149 |

* cited by examiner

Primary Examiner—Timothy P. Callahan
Assistant Examiner—An T. Luu
(74) Attorney, Agent, or Firm—Townsend and Townsend and Crew, LLP

(57) ABSTRACT

A circuit is provided that aligns the phase of a delay signal with an input clock signal. The circuit functions as a phase locked loop (PLL) in a first state of operation and as a delay locked loop (DLL) in a second state of operation. An adjustable delay circuit generates the delay signal. A phase detector compares the input clock signal to the delay signal to generate a phase detection signal. The adjustable delay circuit adjusts the phase of the delay signal in response to the phase detection signal. A multiplexer couples the delay signal back to the input of the adjustable delay circuit using a feedback loop in the first state of operation. The multiplexer couples the input clock signal to the input of the adjustable delay circuit in the second state of operation.

23 Claims, 3 Drawing Sheets

HYBRID PHASE/DELAY LOCKED LOOP CIRCUITS AND METHODS

BACKGROUND OF THE INVENTION

The present invention relates to the field of electronic circuits, and more particularly, to circuits that include many of the features and advantages of delay locked loops and phase locked loops.

A phase-locked loop (PLL) is a circuit that measures variations in the phase of an input signal. A PLL operates by adjusting the phase of a periodic signal generated by an oscillator. The PLL aligns the phase of the oscillator signal with the phase of the input signal. Variations in the phase of the oscillator signal track variations in the phase of the input signal. When the phase of the oscillator signal and the input signal are perfectly aligned, the two signals are said to be in lock. Typically, a PLL has several programmable frequency dividers that multiply or divide down the frequency of the input signal.

A delay-locked loop (DLL) is a circuit that delays an input signal by an adjustable time period. A DLL generates an output signal using an adjustable delay circuit. The output signal is a time delayed version of the input signal. The DLL automatically adjusts the time delay between the input and output signals to equal approximately one period of the input signal.

Many types of integrated circuits can use either a PLL or a DLL to perform a desired function. For example, programmable logic devices (PLDs) use either a PLL or a DLL to generate on-chip clock signals. A DLL or a PLL circuit can be used to offset the phase of an off-chip clock signal in order to improve either the setup time or the clock-to-output delay of input/output signals (e.g., by anticipating the next clock edge).

Both DLLs and PLLs have advantages and disadvantages. PLLs can be used to generate a stable signal when the input signal has a large jitter. PLLs can also be used to multiply and divide down a clock signal by large integer or by rational ratios.

DLLs have less jitter and drift than PLLs when the incoming clock already has a low jitter. DLLs can also lock and resynchronize more quickly to changes in the phase of the incoming clock signal, and have more robust stability constraints. However, DLLs cannot be easily used to divide or multiply the frequency of the incoming clock signal.

Because some applications can use either a PLL or a DLL to perform a particular function, a design engineer must consider the trade-offs between the advantages and disadvantages of using these two types of circuits. It would therefore be desirable to provide a circuit that can align the phase of an output signal with the phase of an input signal and that has the advantages of both a DLL and a PLL.

BRIEF SUMMARY OF THE INVENTION

The present invention provides circuits and methods for adjusting the phase of a periodic clock signal using a hybrid PLL/DLL circuit. A hybrid PLL/DLL circuit of the present invention functions as a phase locked loop (PLL) in a first state of operation and as a delay locked loop (DLL) in a second state of operation.

A hybrid PLL/DLL circuit aligns the phase of a periodic delay signal with an input clock signal. An adjustable delay circuit generates the delay signal. A phase detector compares the input clock signal to the delay signal to generate a phase detection signal. The adjustable delay circuit adjusts the phase of the delay signal in response to the phase detection signal.

A multiplexer couples the delay signal back to the input of the adjustable delay circuit using a feedback loop in the first state of operation. After a period of time, the multiplexer couples the input clock signal to the input of the adjustable delay circuit in the second state of operation.

Circuits of the present invention have many of the advantages of both phase locked loops and delays locked loops. For example, circuits of the present invention can adjust the phase of the output signal to align instantaneously with changes in the phase of the input signal in the second state of operation.

Also, the jitter and the drift of the output signal is matched to the jitter and drift of the input signal during the second state of operation. In addition, circuits of the present invention can adjust the frequency of the output signal to match changes in the frequency of the input signal more quickly than standard PLL circuits. Further, the frequency of the output signal can be divided by a ratio of N/M using frequency dividers.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
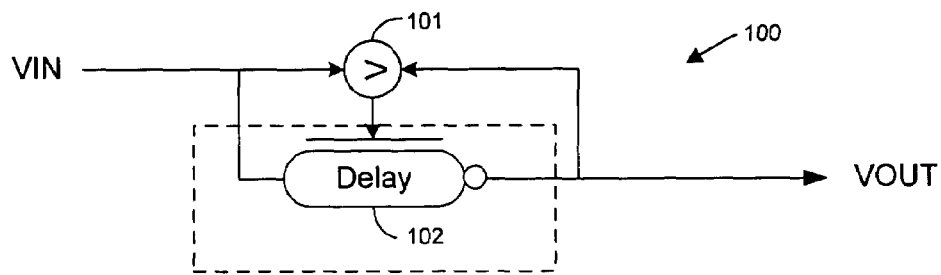
FIG. 1 is block diagram of a delay locked loop circuit.

FIG. 1 illustrates an embodiment of a delay locked loop (DLL) circuit 100. DLL 100 includes a phase detector circuit 101 and an adjustable delay circuit 102. Adjustable delay circuit 102 in DLL 100 receives clock signal VIN as an input signal and generates clock signal VOUT as an output signal. Adjustable delay circuit 102 delays VIN to generate VOUT. Thus, VOUT is a delayed and inverted version of VIN. VOUT can be delayed with respect to VIN, for example, by one-half of a period of VIN. Adjustable delay circuit 102 can include, for example, a plurality of buffers (e.g., inverters) coupled together in series between VIN and VOUT.

Phase detector circuit 101 include a phase comparator. The phase comparator compares the phase of input signal VIN with the phase of output signal VOUT. Phase detector 101 transmits a phase detection signal to adjustable delay 102 that indicates if VIN and VOUT are out of phase and by how much they are out of phase. In response to the phase detection signal, adjustable delay circuit 102 controls the delay between VIN and VOUT.

For example, if phase detector 101 determines that corresponding rising edges of VIN and VOUT are offset by more than one period, the phase detection signal causes adjustable delay circuit 102 to decrease the phase of VOUT. Adjustable delay circuit 102 can decrease the phase of VOUT by decreasing the delay introduced between signals VIN and VOUT. Delay circuit 102 continues to decrease the phase of VOUT until the phase detection signal indicates that the phases of VIN and VOUT are offset by one period of VIN.

If phase detector 101 determines that the phases of VIN and VOUT are offset by less than one period, the phase detection signal causes adjustable delay circuit 102 to increase the phase of VOUT. Delay circuit 102 can increase the phase of VOUT by increasing the delay introduced between signals VIN and VOUT. Delay circuit 102 continues to increase the phase of VOUT until the phase detection signal indicates that the phases of VIN and VOUT are offset by one period of VIN.

Adjustable delay circuit 102 can, for example, include a capacitor coupled between two of the buffers in the delay circuit. Delay circuit 102 can cause the charge and/or discharge rate of the capacitor to vary in response to the phase detection signal.

Figure 2:
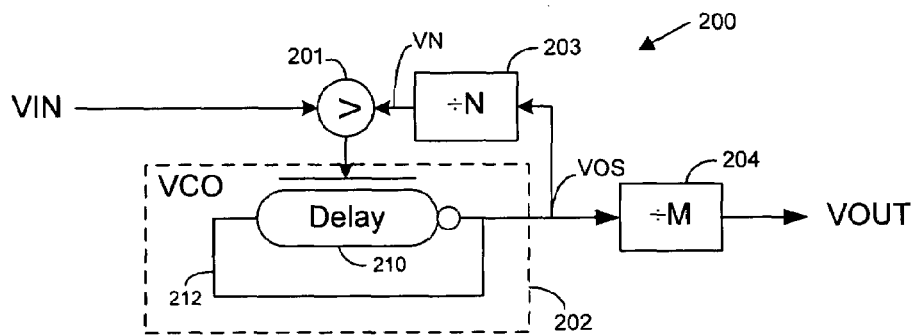
FIG. 2 is a block diagram of a phase locked loop circuit.

FIG. 2 illustrates an embodiment of a phase locked loop (PLL) circuit 200. PLL 200 includes a phase detector 201, a voltage controlled oscillator (VCO) 202, and frequency dividers 203–204. PLL 200 also receives a clock input signal VIN and generates a clock output signal VOUT. VCO 202 generates a periodic clock signal VOS as shown in FIG. 2.

Frequency divider 203 divides the frequency of VOS by a first whole number N to generate a signal VN. The frequency of VN is 1/N times the frequency of VOS. Frequency divider 204 divides the frequency of VOS by a second whole number M to generate output signal VOUT. The frequency of VOUT is N/M times the frequency of VIN.

The frequency of VOS is typically much larger than the frequency of input signal VIN. Frequency divider 203 divides the frequency of VOS to generate a signal VN with a frequency that is closer to the frequency of VIN.

Phase detector 201 includes a comparator that compares the phases of input signal VIN with signal VN. Phase detector 201 transmits a phase detection signal to VCO 202 that indicates the difference between the phases of VIN and VN. Phase detector 201 can also include a charge pump circuit and/or a level shift circuit that increase the voltage of the comparator output signal. Further details of functional and structural embodiments of a phase locked loop circuit that can be incorporated into hybrid PLL/DLL circuits of the present invention are discussed in detail in commonly assigned U.S. Pat. No. 6,369,624, filed Nov. 2, 1999, to Wang et al., which is incorporated by reference herein.

The phase detection signal is transmitted to an input of VCO 202. VCO 202 includes an adjustable delay circuit 210. Adjustable delay circuit 210 controls when the edges of clock signal VOS occur. Adjustable delay circuit 210 can, for example, include an odd number of inverting buffers coupled together in series. An alternating signal passes through the buffers. The output of one of the buffers generates periodic clock signal VOS. Delay circuit 210 is shown with an inversion at its output to indicate that delay circuit 210 inverts VIN to generate VOS.

VCO 202 can include, for example, a ring oscillator. A ring oscillator includes an odd number of inverting buffer circuits coupled to a feedback loop. Feedback loop 212 shown in FIG. 2 is the feedback loop. Feedback loop 212 is coupled to an input and an output of adjustable delay circuit 210. Feedback loop 212 couples the buffers in delay circuit 210 together into a ring oscillator.

Adjustable delay circuit 210 controls the phase of VOS in response to the phase detection signal. For example, adjustable delay circuit 210 can include a capacitor coupled between a chain of buffers coupled together in delay circuit 210. The phase detection signal from detector 201 controls the charge and/or discharge rate of the capacitor to adjust the phase of VOS.

When VIN and VN are out of phase, the phase detection signal causes adjustable delay circuit 210 to change the phase of VOS so that VN aligns with VIN. When VN and VIN are aligned, VCO 202 maintains the phase of VOS constant in response to the phase detection signal. Further details of the operation of an exemplary phase detector circuit are discussed in U.S. Pat. No. 6,369,624 mentioned above.

Figure 3:
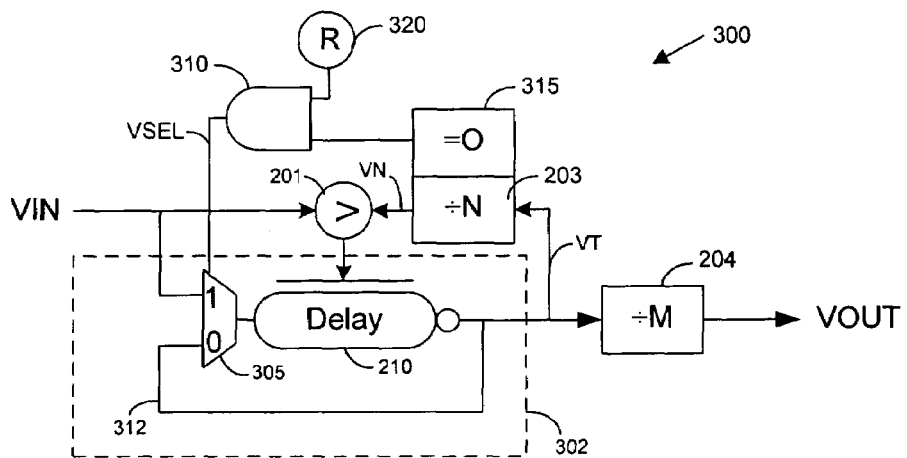
FIG. 3 is a block diagram of an embodiment of a hybrid PLL/DLL circuit according to the present invention.

FIG. 3 illustrates an embodiment of a hybrid PLL/DLL circuit 300 of the present invention. Circuit 300 includes circuit 302, phase detector circuit 201, frequency dividers 203–204, AND gate 310, memory circuit 320, and edge detector circuit 315. Circuit 302 includes a multiplexer 305, feedback loop 312, and adjustable delay circuit 210 that are coupled as shown in FIG. 3.

Hybrid PLL/DLL circuit 300 functions in two different states of operation. In the first state of operation, circuit 300 attempts to align the phase of input clock signal VIN with an internally generated clock signal. Circuit 302 is configured as a voltage control oscillator (VCO) in the first state of operation to generate a delay clock signal VT.

During the first state of operation, memory bit 320 is set HIGH to pass the output signal of edge detector 315 to the select input of multiplexer 305 as VSEL. Edge detector 315 can be part of divider circuit 203.

Figure 4:
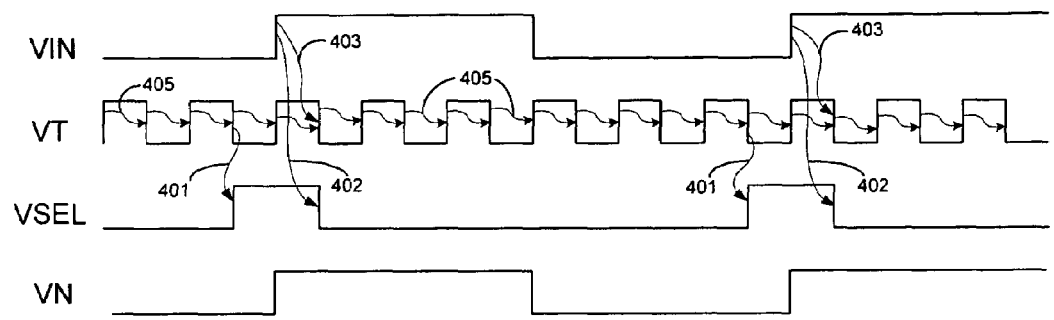
FIG. 4 is a timing diagram that illustrates examples of signals generated by the circuit if FIG. 3 in hybrid PLL/DLL mode.

The output signal of edge detector 315 (and VSEL) go HIGH one-half of a VT cycle before a rising edge of VN (see, e.g., FIG. 4). The output signal of edge detector 315 (and VSEL) go LOW one-half of a VT cycle after the rising edge of VN. The output signal of edge detector 315 and VSEL are HIGH for one period of VT.

Edge detector 315 can be, for example, a counter circuit. The counter circuit can be part of divider 203. According to this embodiment of the present invention, the counter circuit counts N−1 rising edges of VT. After the counter circuit detects N−1 rising edges of VT, the counter circuit causes VSEL to go HIGH one-half of a VT clock cycle before a rising edge of VN. After VSEL goes HIGH, the counter circuit resets its count value to zero. VSEL goes LOW after one period of VT. After VSEL goes LOW, the counter circuit begins to count the rising edges of VT again.

When the output signal of edge detector 315 is LOW (and memory bit 320 is HIGH), VSEL is LOW, causing multiplexer 305 to couple feedback loop 312 to an input of adjustable delay circuit 210. Adjustable delay circuit 210 can comprise an odd number of inverting buffers, as discussed above. When feedback loop 312 is coupled around adjustable delay circuit 210, circuit 210 operates as a voltage controlled oscillator (VCO).

VCO 302 provides an internally generated clock signal VT, as discussed above with respect to VCO 202 of FIG. 2. The frequency of clock signal VT is typically larger than the frequency of VIN. For example, the frequency of VT can be N times the frequency of VIN. Dividers 203 and 204 divide the frequency of VT by numbers N and M, respectively. Divider 203 divides the frequency of VT by N so that it equals the frequency of VIN. Divider 204 generates output signal VOUT.

Phase detector 201 compares the phase of VN with the phase of an input clock signal VIN. Phase detector 201 generates a phase detection signal that indicates the phase difference between VIN and VN. Adjustable delay circuit 210 adjusts the phase of VT in response to the phase detection signal so that the phases of VIN and VN are aligned with each other, e.g., using a capacitor, as discussed above.

For example, if a rising edge of VN arrives before a rising edge of VIN, VCO 302 delays subsequent edges of VT. If a rising edge of VN arrives after a rising edge of VIN, VCO 302 causes subsequent edges of VT to occur earlier in time. When the rising edge of VIN aligns with the Nth rising edge of VT, circuit 300 is in equilibrium. Thus, in the first state of operation, circuit 300 operates much like a PLL.

The output signal of edge detector 315 goes HIGH one-half a period of VT before a rising edge of VN. When the output signal of edge-detector 315 is HIGH (and memory bit 320 is HIGH), VSEL is HIGH. VSEL remains HIGH for one period of VT. The second state of operation occurs when VSEL is HIGH.

When VSEL is HIGH, multiplexer 305 couples input clock signal VIN to an input of adjustable delay circuit 210. Feedback loop 312 is decoupled from the multiplexer 305 input of delay circuit 210. Therefore, circuit 302 does not act as a VCO. Instead, circuit 302 delays the edges of VIN to generate delay clock signal VT. Delay circuit 210 delays falling edges of VT by one-half a period of VT with respect to corresponding rising edges of VIN.

When VSEL is HIGH, a rising edge of VIN causes a falling edge of VT, because delay circuit 210 inverts VIN. The second state of operation is similar to the operation of a delay locked loop circuit.

In the second state of operation, frequency divided signal VN is compared with VIN to determine if there is a phase offset between the two signals. If a phase offset exists between VIN and VN, adjustable delay circuit 210 adjusts its delay time to the shift the phase of VT so that edges of VN and VIN are aligned.

The second state of operation lasts as long as VSEL is HIGH. Typically, VSEL is HIGH for one clock period of VT. However, in further embodiments of the present invention, the second state of operation can last for a longer or shorter period of time.

When the output signal of edge detector 315 transitions LOW again, VSEL also transitions LOW, feedback loop 312 converts circuit 302 back into a voltage controlled oscillator, and circuit 300 returns to the first state of operation.

The memory bit 320 can be pulled LOW to disable the second state of operation. When bit 320 is LOW, VSEL remains LOW even when the output of edge detector 315 goes HIGH. Circuit 302 remains configured as a VCO, and circuit 300 continuously operates in the first state of operation.

FIG. 4 is a timing diagram that illustrates examples of signals generated by circuit 300 when it operates in hybrid PLL/DLL mode. Circuit 300 operates in hybrid PLL/DLL mode when memory bit 320 is HIGH. FIG. 4 illustrates signals VIN, VT, VN, and VSEL. When VSEL is LOW, circuit 300 operates in the first state of operation. And when VSEL is HIGH, circuit 300 operates in the second state of operation.

When VSEL is LOW, circuit 302 operates as a voltage controlled oscillator. The VCO generates clock signal VT. Feedback loop 312 causes each HIGH pulse in VT to be related to the previous HIGH VT pulse. Each HIGH VT pulse is feed back through loop 312 to the input of delay circuit 210 to start the next HIGH VT pulse. The relationship between adjacent HIGH pulses in VT when VSEL is LOW is shown by arrows 405 in FIG. 4. Because of this relationship, circuit 302 cannot change the phase of VT instantaneously to align with the phase of VIN when operating as a VCO in the first state of operation.

In the example of FIG. 4, VSEL transitions HIGH to begin the second state of operation. The VSEL goes HIGH one-half of a VT cycle before the rising edge of VN. Arrows 401 from the falling edges of VT to the rising edges of VSEL in FIG. 4 illustrate their relationship. The VSEL remains HIGH for one period of VT and then returns to LOW one-half a VT period after the rising edge of VN. This relationship is illustrated by arrows 402 in FIG. 4.

When VSEL is HIGH, feedback loop 312 is decoupled from adjustable delay circuit 302, and multiplexer 305 provides VIN to the input of adjustable delay circuit 210. Thus, VT becomes a delayed version of VIN in the second state of operation. A rising edge in VIN that enters delay circuit 210 causes a corresponding falling edge in VT, because of the inversion in circuit 210. The rising edge of VT is delayed with respect to the corresponding falling edge in VIN by one-half a period of VT. The relationship between the edges of VIN and VT in the second state of operation are shown by arrows 403 in FIG. 4.

Circuit 300 is typically designed to operate in the first state of operation most of the time as shown in FIG. 4. In the first state of operation, the phase and frequency of VOUT cannot change instantaneously to match rapid changes in the phase or frequency of VIN. Therefore, output signal VOUT of circuit 300 is stable even when the input signal VIN has a large jitter.

Circuit 300 can also use frequency dividers 203–204 to multiply the frequency of input signal VIN by a ratio N/M to generate the output signal VOUT. Thus, circuits of the present invention can provide many of the advantages of PLLs. According to further embodiments of the present invention, frequency dividers 203–204 can be removed. In these embodiments, phase detector 201 compares VIN directly to VOUT.

During the second state of operation, circuit 300 of the present invention can adjust the phase of output signal VOUT instantaneously to match changes in the phase and frequency of input signal VIN. Circuit 300 can lock and resynchronize more quickly to changes in the phase of input signal VIN than a standard PLL.

Also during the second state of operation of circuit 300, the jitter and drift in output signal VOUT matches the jitter and drift in input signal VIN. As a result, when the input signal VIN already has a low jitter, VOUT has less jitter and drift than a standard PLL output signal. Thus, circuits of the present invention also provide many of the advantages of DLLs.

Figure 5:
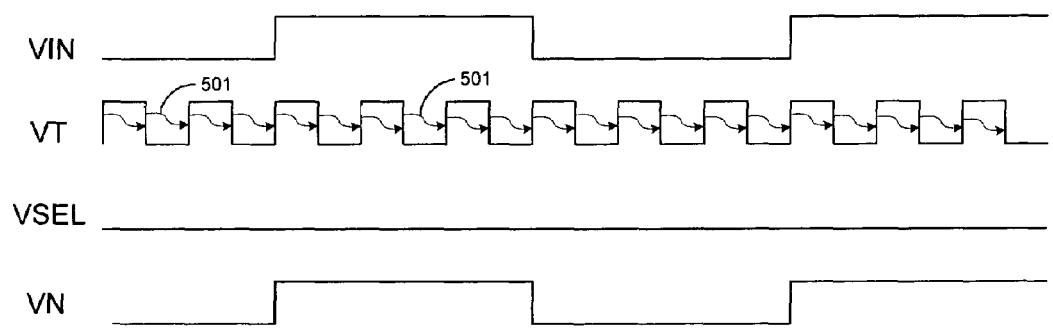
FIG. 5 is a timing diagram that illustrates examples of signals generated by the circuit if FIG. 3 in PLL mode.

FIG. 5 is a timing diagram that illustrates examples of signals generated by circuit 300 when it operates in PLL mode. Circuit 300 operates in PLL mode when memory bit 320 is LOW. FIG. 5 illustrates signals VIN, VT, VN, and VSEL.

VSEL is always LOW in PLL mode, and circuit 302 operates as a voltage controlled oscillator. Feedback loop 312 causes each HIGH pulse in VT to be related to the previous HIGH VT pulse. The relationship between adjacent HIGH pulses in VT in PLL mode is shown by arrows 501 in FIG. 5.

PLLs and DLLs can be used in programmable integrated circuits to maintain a specific phase relationship between the master clock and the internal clock. Examples of programmable integrated circuits include programmable logic devices (PLDs), field programmable gate arrays (FPGAs), programmable logic arrays (PLAs), configurable PLDs, configurable gate arrays, etc.

Figure 6:
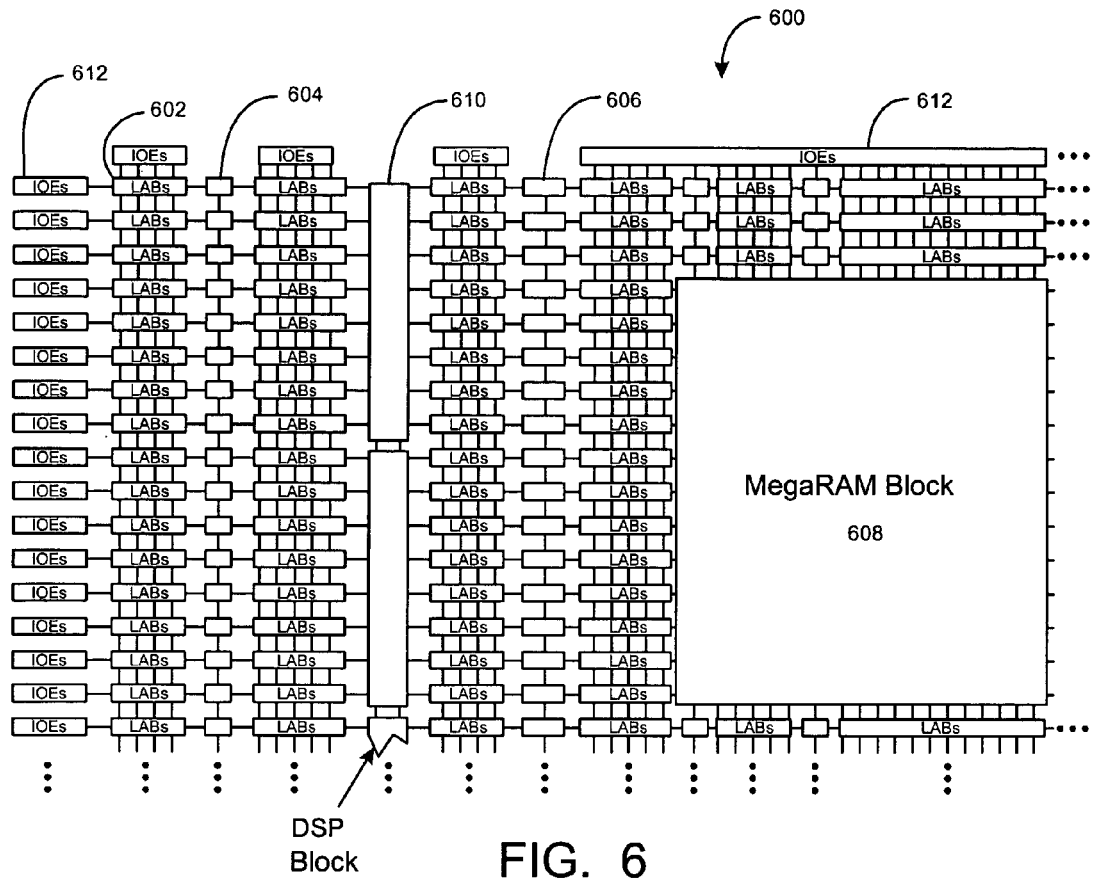
FIG. 6 is a simplified block diagram of a programmable logic device that can implement embodiments of the present invention.

FIG. 6 is a simplified partial block diagram of an exemplary high-density PLD 600. Techniques of the present invention can be utilized in a PLD such as PLD 600. PLD 600 includes a two-dimensional array of programmable logic array blocks (or LABs) 602 that are interconnected by a network of column and row interconnects of varying length and speed. LABs 602 include multiple (e.g., 10) logic elements (or LEs). An LE is a small unit of logic that provides for efficient implementation of user defined logic functions.

PLD 600 also includes a distributed memory structure including RAM blocks of varying sizes provided throughout the array. The RAM blocks include, for example, 512 bit blocks 604, 4K blocks 606 and a MegaBlock 608 providing 512K bits of RAM. These memory blocks may also include shift registers and FIFO buffers. PLD 600 further includes digital signal processing (DSP) blocks 610 that can implement, for example, multipliers with add or subtract features. I/O elements (IOEs) 612 located, in this example, around the periphery of the device support numerous single-ended and differential I/O standards. It is to be understood that PLD 600 is described herein for illustrative purposes only and that the present invention can be implemented in many different types of PLDs, FPGAs, and the like.

Figure 7:
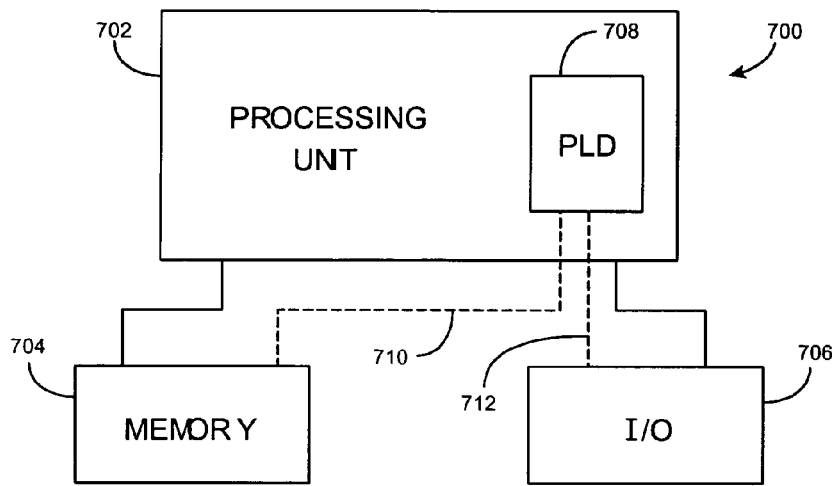
FIG. 7 is a block diagram of an electronic system that can implement embodiments of the present invention.

While PLDs of the type shown in FIG. 6 provide many of the resources required to implement system level solutions, the present invention can also benefit systems wherein a PLD is one of several components. FIG. 7 shows a block diagram of an exemplary digital system 700, within which the present invention may be embodied. System 700 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 700 may be provided on a single board, on multiple boards, or within multiple enclosures.

System 700 includes a processing unit 702, a memory unit 704 and an I/O unit 706 interconnected together by one or more buses. According to this exemplary embodiment, a programmable logic device (PLD) 708 is embedded in processing unit 702. PLD 708 can serve many different purposes within the system in FIG. 7. PLD 708 can, for example, be a logical building block of processing unit 702, supporting its internal and external operations. PLD 708 is programmed to implement the logical functions necessary to carry on its particular role in system operation. PLD 708 may be specially coupled to memory 704 through connection 710 and to I/O unit 706 through connection 712.

Processing unit 702 can direct data to an appropriate system component for processing or storage, execute a program stored in memory 704 or receive and transmit data via I/O unit 706, or other similar function. Processing unit 702 may be a central processing unit (CPU), microprocessor, floating point coprocessor, graphics coprocessor, hardware controller, microcontroller, programmable logic device programmed for use as a controller, network controller, and the like.

Furthermore, in many embodiments, there is often no need for a CPU. For example, instead of a CPU, one or more PLDs 708 can control the logical operations of the system.

In an embodiment, PLD 708 acts as a reconfigurable processor, which can be reprogrammed as needed to handle a particular computing task. Alternately, programmable logic device 708 can itself include an embedded microprocessor. Memory unit 704 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for aligning an input clock signal with a delay clock signal, the method comprising:
    detecting phases of the input clock signal and the delay clock signal to generate a phase detection signal by dividing a frequency of the delay clock signal using a first frequency divider to generate a first frequency divided delay signal, and comparing phases of the input clock signal with the first frequency divided delay signal to generate the phase detection signal using a phase comparator;
    detecting edges of the delay clock signal to generate a detect signal;
    selecting the delay clock signal or the input clock signal to provide a selection signal in response to the detect signal; and
    controlling a delay of the selection signal in response to the phase detection signal to generate the delay clock signal.

2. The method of claim 1 further comprising:
    dividing the frequency of the delay clock signal using a second frequency divider to generate an output clock signal.

3. The method of claim 2 further comprising:
    providing the output clock signal to programmable circuit elements in a programmable integrated circuit.

4. The method of claim 1 wherein selecting the delay clock signal or the input clock signal to provide the selection signal in response to the detect signal further comprises:
    selecting the delay clock signal as the selection signal regardless of the value of the detect signal when a disable signal has a predefined value.

5. A method for aligning an input clock signal with a delay clock signal, the method comprising:
    detecting phases of the input clock signal and the delay clock signal to generate a phase detection signal;
    detecting edges of the delay clock signal to generate a detect signal;
    selecting the delay clock signal or the input clock signal to provide a selection signal in response to the detect signal; and
    controlling a delay of the selection signal in response to the phase detection signal to generate the delay clock signal, wherein selecting the delay clock signal or the input clock signal to provide the selection signal in response to the detect signal further comprises:

coupling a feedback loop around an adjustable delay circuit to form an oscillator circuit that generates the delay clock signal when the detect signal has a first value that selects the delay clock signal as the selection signal; and decoupling the feedback loop from an input of the adjustable delay circuit when the detect signal has a second value that selects the input clock signal as the selection signal.

6. The method of claim 5 wherein controlling the delay of the selection signal in response to the phase detection signal to generate the delay clock signal further comprises:

increasing the delay of the selection signal through an adjustable delay circuit when the phase detection signal indicates that an edge of the delay signal is ahead of a corresponding edge of the input signal; and decreasing the delay of the selection signal through the adjustable delay circuit when the phase detection signal indicates that an edge of the delay signal is behind a corresponding edge of the input signal.

7. A circuit for aligning a periodic input signal with a delay signal, the circuit comprising:

a phase detector having a first input coupled to the periodic input signal;

an adjustable delay circuit coupled to an output of the phase detector that generates the delay signal at an output of the adjustable delay circuit;

a feedback loop circuit coupled to the output of the adjustable delay circuit;

an edge detector circuit having an input coupled to the output of the adjustable delay circuit;

a multiplexer having data inputs coupled to the feedback loop and the periodic input signal, a select input coupled to receive a detect signal from the edge detector circuit, and an output coupled to an input of the adjustable delay circuit; and a first frequency divider circuit having an input coupled to the output of the adjustable delay circuit and an output coupled to a second input of the phase detector, the first frequency divider dividing a frequency of the delay signal by N to generate a divided signal.

8. The circuit according to claim 7 wherein the edge detector circuit generates a HIGH pulse one-half a period of the delay signal before a rising edge of the divided signal.

9. The circuit according to claim 7 wherein the first frequency divider is a counter circuit, and the edge detector circuit generates a HIGH pulse after the counter circuit counts a predetermined number of edges of the delay signal.

10. The circuit according to claim 7 further comprising:

a second frequency divider circuit having an input coupled to the output of the adjustable delay circuit that generates a periodic output signal, wherein the second frequency divider divides a frequency of the delay signal by M, and the periodic output signal has a frequency that is N/M times the frequency of the input signal.

11. The circuit according to claim 7 further comprising:

a logic gate coupled to the select input of the multiplexer, to an output of the edge detector circuit, and to a memory cell.

12. The circuit according to claim 11 wherein the adjustable delay circuit comprises an odd number of inverting buffers coupled together in series.

13. The circuit according to claim 11 wherein:

the feedback loop is coupled to the input of the adjustable delay circuit when the detect signal is in a first state, and the input of the adjustable delay circuit receives the periodic input signal when the detect signal is in a second state, the edge-detector circuit causing the detect signal to transition from the first state to the second state, and causing the detect signal to transition from the second state to the first state after one period of the delay signal.

14. A circuit for aligning an input clock signal with a delay signal, the circuit comprising:

means for detecting a phase difference between the input clock signal and the delay signal to generate a phase difference signal;

means for controlling a phase of the delay signal in response to the phase difference signal;

means for detecting edges of the delay signal to generate a detect signal;

means for selecting the input clock signal or the delay signal as a selected signal in response to a value of the detect signal, wherein the selected signal is delayed by the means for controlling to generate the delay signal; and means for dividing a frequency of the delay signal by N to generate a first divided signal, wherein the means for detecting the phase difference between the input clock signal and the delay signal compares the input clock signal to the first divided signal.

15. The circuit defined in claim 14 further comprising:

means for dividing the frequency of the delay signal by M to generate an output clock signal, wherein a frequency of the output clock signal is N/M times the frequency of the input clock signal.

16. The circuit defined in claim 14 further comprising:

means for causing the means for selecting to select the delay signal as the selected signal regardless of the value of the detect signal when a disable signal is a predetermined value.

17. The circuit defined in claim 14 wherein the means for detecting the edges of the delay signal counts falling edges of the delay signal.

18. The circuit defined in claim 14 wherein the means for selecting selects the delay signal as the selected signal during a first state of operation, and the means for selecting selects the input clock signal as the selected signal for one period of the delay signal during a second state of operation.

19. The circuit defined in claim 18 wherein the circuit for aligning the input clock signal with the delay signal in part of a field programmable gate array.

20. A circuit that is a hybrid of a phase-locked loop (PLL) and a delay locked loop (DLL), the circuit comprising:

a phase detector circuit that receives an input clock signal;

an adjustable delay circuit coupled to receive an output of the phase detector circuit, the adjustable delay circuit generating a delay signal; and a selector that selects the delay signal as a selected signal during a first state of operation to cause the circuit to operate as a PLL, and wherein the selector selects the input clock signal as the selected signal during a second state of operation to cause the circuit to operate as a DLL;

a first frequency divider coupled to receive the delay signal and coupled to transmit a divided signal to an input of the phase detector.

21. The circuit defined in claim 20 further comprising:

a second frequency divider circuit coupled to receive the delay signal.

22. The circuit defined in claim 20 wherein the frequency divider is a counter circuit.

23. A circuit that is a hybrid of a phase-locked loop (PLL) and a delay locked loop (DLL), the circuit comprising:

a phase detector circuit that receives an input clock signal;

an adjustable delay circuit coupled to receive an output of the phase detector circuit, the adjustable delay circuit generating a delay signal;

a selector that selects the delay signal as a selected signal during a first state of operation to cause the circuit to operate as a PLL, and wherein the selector selects the input clock signal as the selected signal during a second state of operation to cause the circuit to operate as a DLL; and a logic gate coupled to a select input of the selector and coupled to receive a signal that causes the circuit to remain in the first state of operation.

* * * * *